United States Patent
Xu et al.

(10) Patent No.: US 11,815,783 B2
(45) Date of Patent: Nov. 14, 2023

(54) MID-INFRARED WAVELENGTH OPTICAL TRANSMITTER AND RECEIVER

(71) Applicant: McMaster University, Hamilton (CA)

(72) Inventors: Chang-qing Xu, Dundas (CA); Joshua Kneller, Hamilton (CA); Liam Flannigan, Hamilton (CA)

(73) Assignee: MCMASTER UNIVERSITY, Hamilton (CA)

( * ) Notice: Subject to any disclaimer, the term of this patent is extended or adjusted under 35 U.S.C. 154(b) by 274 days.

(21) Appl. No.: 17/091,362

(22) Filed: Nov. 6, 2020

(65) Prior Publication Data

US 2021/0141282 A1 May 13, 2021

Related U.S. Application Data

(60) Provisional application No. 62/932,972, filed on Nov. 8, 2019.

(51) Int. Cl.
*G02F 1/35* (2006.01)
*H01S 5/00* (2006.01)
(Continued)

(52) U.S. Cl.
CPC .......... *G02F 1/3534* (2013.01); *H01S 3/1083* (2013.01); *H01S 5/0092* (2013.01);
(Continued)

(58) Field of Classification Search
CPC .... G02F 1/3532; G02F 1/3534; H01S 3/1083; H01S 5/0092
See application file for complete search history.

(56) References Cited

U.S. PATENT DOCUMENTS

| 5,333,142 A | 7/1994 | Scheps |
| 5,912,910 A | 6/1999 | Sanders et al. |

(Continued)

FOREIGN PATENT DOCUMENTS

| CN | 102324962 B | 1/2012 |
| CN | 104410463 A | 3/2015 |

(Continued)

OTHER PUBLICATIONS

Janusz Mikolajczyk et al. "Analysis of Free-Space Optics Development". Metrology and Measurement Systems. vol. 24, No. 4, pp. 653-674. 2017.

(Continued)

*Primary Examiner* — Daniel Petkovsek
(74) *Attorney, Agent, or Firm* — Bereskin & Parr LLP; Denis Keseris

(57) ABSTRACT

A difference frequency generation optical transmitter and sum frequency generation optical receiver operating in the mid-infrared wavelength range for use in free space optical satellite communications are described. By using mid-infrared light, the transmitter/receiver can mitigate atmospheric scintillation, scattering, and other non-ideal optical effects in the communication channel. This is achieved through the use of nonlinear optical crystals designed for difference frequency generation in the case of the transmitter and sum frequency generation for the receiver. High-speed modulated communication signals can thus be frequency converted to the mid-infrared wavelength range by a relatively low cost, compact and high-power optical communication system.

10 Claims, 6 Drawing Sheets

(51) Int. Cl.
*H01S 3/108* (2006.01)
*G02B 1/11* (2015.01)
*G02B 27/14* (2006.01)
*H04B 10/118* (2013.01)

(52) U.S. Cl.
CPC ............. *G02B 1/11* (2013.01); *G02B 27/141* (2013.01); *H04B 10/118* (2013.01)

(56) References Cited

U.S. PATENT DOCUMENTS

| | | | |
|---|---|---|---|
| 5,923,452 | A | 7/1999 | Carlson |
| 7,792,162 | B2 * | 9/2010 | Piper .................... H01S 3/1086 372/20 |
| 9,001,853 | B2 * | 4/2015 | Kane .................... H01S 3/1083 372/21 |
| 9,231,373 | B2 * | 1/2016 | Fallahi ................. H01S 5/4087 |
| 2001/0012142 | A1 | 8/2001 | Carlson |
| 2002/0181059 | A1 | 12/2002 | Christopher |
| 2003/0206691 | A1 | 11/2003 | Puzey |
| 2006/0153254 | A1 * | 7/2006 | Franjic .................... G02F 1/39 372/30 |
| 2009/0122816 | A1 * | 5/2009 | Wagner ................. H01S 3/1068 372/20 |
| 2012/0281741 | A1 | 11/2012 | Feher |
| 2021/0234328 | A1 * | 7/2021 | Bell ........................ H01S 3/108 |

FOREIGN PATENT DOCUMENTS

| | | |
|---|---|---|
| CN | 106533562 A | 3/2017 |
| EP | 0054582 B1 | 3/1986 |
| EP | 1097530 B1 | 5/2006 |
| EP | 0989692 B1 | 7/2006 |

OTHER PUBLICATIONS

Md. Nur Islam and Md Nur Al Safa Bhuiyan. "Effect of Operating Wavelengths and Different Weather Conditions on Performance of Point-to-Point Free Space Optical Link". International Journal of Computer Networks & Communications (IJCNC). vol. 8, No. 2. Mar. 2018.

E. Leitgeb et al. "Analysis and Evaluation of Optimum Wavelengths for Free-Space Optical Transceivers". International Conference on Transparent Optical Networks (ITCON) 2010.

\* cited by examiner

MID-INFRARED WAVELENGTH OPTICAL TRANSMITTER AND RECEIVER

This application claims the benefit of Provisional Application Ser. No. 62/932,972, filed Nov. 8, 2019, which is hereby incorporated herein by reference.

FIELD

The present disclosure relates to the general field of free space optical communications. In particular, the present disclosure relates to difference and sum frequency generation techniques used in optical transmitters and receivers for use in optical satellite communication systems.

INTRODUCTION

Satellite technology is an increasingly important part of modern scientific research. An important aspect of satellite technology is the ability to communicate with a satellite by transmitting and receiving information as necessary. This is often achieved using radio and microwave telecommunications for telephone, radio, internet, or military applications. The use of such systems however requires international efforts and coordination to allocate the relevant frequency bands under the International Telecommunication Union (ITU). Over the past few decades, these communication bands have become increasingly crowded and complicated to manage as more satellites are created and launched into orbit.

Unfortunately, the longer wavelengths and lower frequencies of radio and microwave communication effectively places a limit on the bandwidth of any communication channel utilizing these methods. It is thought that this will prove to be particularly problematic for future space missions, as ever-increasing amounts of data will need to be sent to ground stations on Earth.

As the inherent bandwidth limits of microwave and radio communication have been approached, recent space missions have turned to optical communication as an alternative. The significantly shorter wavelengths and higher frequencies of optical radiation (covering the ultraviolet, visible, and infrared spectrums) allow for much higher data rates than other alternatives, as evidenced by modern optical fiber-based communication, which is now capable of reaching data rates in the multiple gigabits per second (Gbps) range. As optical satellite communication precludes the use of optical fiber, such communication must propagate through free space and through Earth's atmosphere, forming part of the broad field of free space optical (FSO) communication.

While a number of light sources have been used for such communication, lasers remain one of the most effective for implementing FSO systems. The high degree of directionality of a laser beam results in a connection that is more secure than a typical radio or microwave system, in which a signal propagated from space can spread out to the size of an entire continent by the time it reaches the Earth's surface. In contrast, an appropriately designed laser system is capable of reaching spot sizes on the order of meters.

Such laser-based FSO systems have been implemented in the past, but they have faced a number of challenges relating to atmospheric attenuation, scintillation, absorption, scattering and other non-ideal optical effects. In particular, the non-ideal optical properties of Earth's atmosphere have led to the development of multiple systems directed to mitigating these effects in FSO satellite communication.

One approach involves using longer wavelength lasers, as these are less susceptible to Rayleigh and Mie scattering, both of which can distort a signal. This approach also avoids eye safety issues posed by attempting to use visible lasers. These systems typically use wavelengths in the 800 nm, 1300 nm and 1500 nm bands. While these wavelengths offer acceptable performance in clear weather and rain, they result in suboptimal performance when used in other atmospheric conditions such as fog. Because fog particles are of comparable size to the transmission wavelengths, Mie scattering is increased. Known systems have mitigated this disadvantage by providing multiple redundant ground stations and transmitters to bypass a particular ground station that may be located in poor weather conditions.

Another approach involves using even longer wavelengths (i.e. mid-infrared) such as the 3 to 5 µm or 8 to 10 µm windows, which limits scattering further. In particular, the 3 to 5 µm wavelength range typically exhibits superior transmission properties to wavelengths in other atmospheric scintillation windows. While some attempts have been made to generate mid-infrared wavelengths using nonlinear optical crystals, those attempts have resulted in inefficient and ineffective communication systems. For example, the inefficiencies associated with such known systems have precluded the attainment of modulation speeds and/or detector response times necessary for modern, high data rate communications. Alternative attempts to generate mid-infrared wavelengths have been made using quantum cascade lasers (QCL), though high-speed optical sources and detectors using this technology can be prohibitively costly.

There is a need for a relatively low cost, compact, high-power, high-speed, mid-infrared wavelength range optical communication system.

SUMMARY

The following summary is intended to introduce the reader to the more detailed description that follows, and not to define or limit the claimed subject matter.

This disclosure provides for an optical transmitter and receiver operating in the mid-infrared wavelength range using a novel nonlinear optics based intracavity design. The system is compact and may be mounted to an Earth-orbiting satellite or high-altitude communication platform for high speed data transfer.

The system provides compact, lightweight, high power, high bit rate capabilities for sending and receiving information via free space optical communications. This is achieved through the use of a nonlinear optical crystal designed for difference frequency generation in the case of the transmitter and sum frequency generation for the receiver. This allows the use of two input lasers to generate a third, different wavelength at the output of the device.

The claimed subject matter provides the advantages of improved signal up-time/availability for satellite optical communication by using mid-infrared light to avoid the vast majority of atmospheric scintillation, scattering, and other non-ideal optical effects in the communication channel.

The claimed subject matter also provides the advantages of increased efficiency over known difference frequency generation and sum frequency generation laser systems using non-linear optical crystals.

According to one aspect of the present disclosure, there is provided a difference frequency generation optical transmitter. The transmitter comprises an optical cavity and a laser configured to emit a modulated signal at a first wavelength. The transmitter also comprises optics configured to direct the modulated signal into the optical cavity and a pumping laser. The optical cavity includes a gain medium configured to emit the laser at a second wavelength when optically excited by the pumping laser. The optical cavity also includes a difference frequency generation nonlinear optical crystal configured to generate a third wavelength in the mid-infrared range, the third wavelength being the difference frequency of the second wavelength and the first wavelength. The optical cavity also includes an output coupler configured to allow partial transmission of the third wavelength.

According to another aspect of the present disclosure, there is provided a sum frequency generation optical receiver. The receiver comprises an optical cavity and a pumping laser. The receiver also comprises optics configured to collimate a received optical signal having a first wavelength in the mid-infrared range and to direct the collimated optical signal into the optical cavity. The optical cavity comprises a gain medium configured to emit a laser at a second wavelength when optically excited by the pumping laser. The optical cavity also comprises a sum frequency generation nonlinear optical crystal configured to generate a third wavelength, the third wavelength being the sum frequency of the first wavelength and the second wavelength. The optical cavity also comprises an output coupler configured to allow partial optical transmission of the third wavelength.

DRAWINGS

In order that the claimed subject matter may be more fully understood, reference will be made to the accompanying drawings, in which:

DESCRIPTION OF VARIOUS EMBODIMENTS

Figure 1:
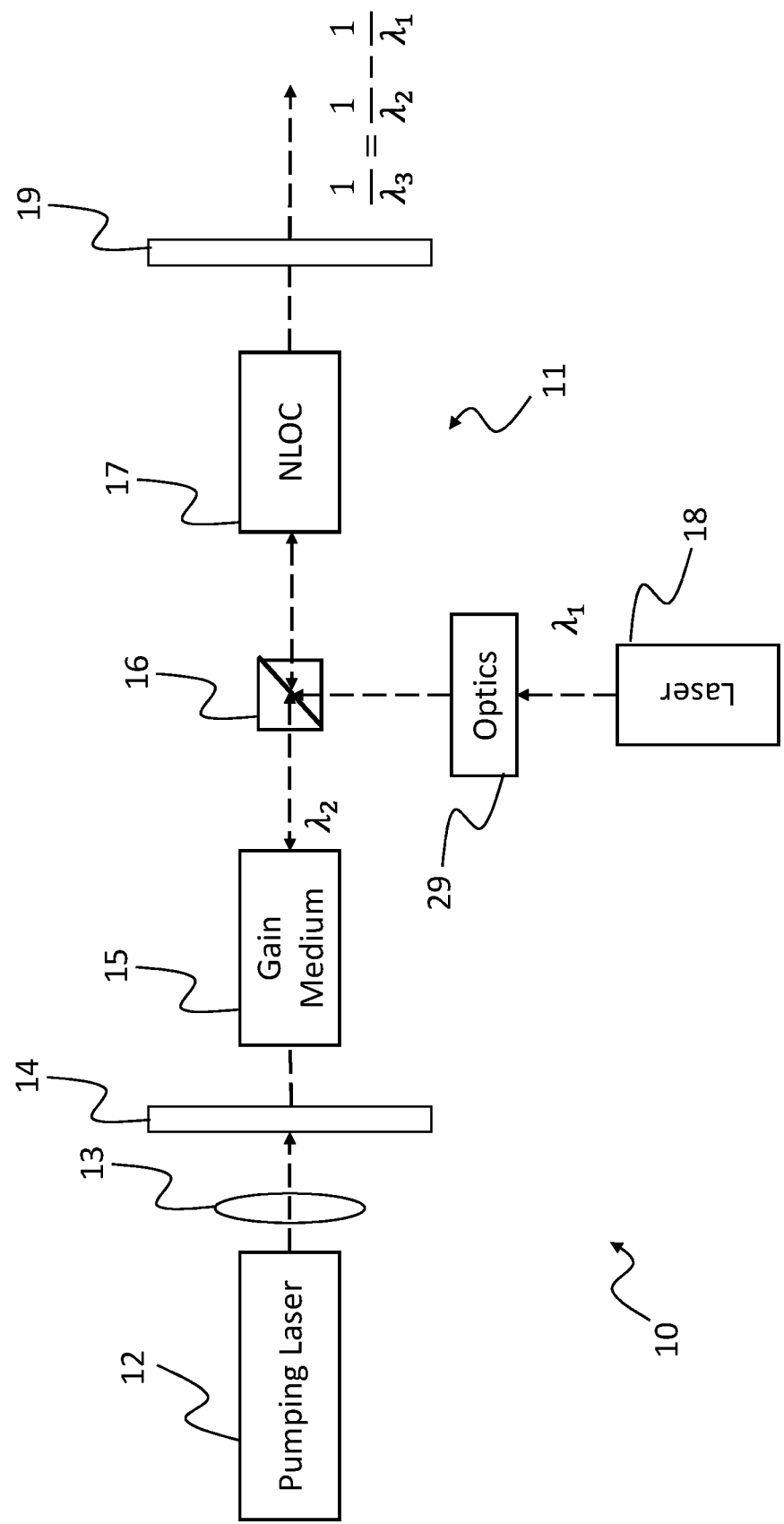
FIG. 1 is a schematic block diagram of an example optical transmitter in accordance with an embodiment of the present disclosure.

It will be appreciated that, for simplicity and clarity of illustration, where considered appropriate, reference numerals may be repeated among the figures to indicate corresponding or analogous elements or steps. Numerous specific details are set forth in order to provide a thorough understanding of the exemplary embodiments of the subject matter described herein.

It will however be understood by those of ordinary skill in the art that the embodiments described herein may be practiced without these specific details. In other instances, well-known methods, procedures and components have not been described in detail so as not to obscure the present subject matter. Furthermore, this description is not to be considered as limiting the scope of the subject matter in any way but rather as illustrating the various embodiments.

As used herein the term "mid-infrared wavelengths" or "mid-infrared wavelength range" is intended to include at least wavelengths of between 3 to 5 µm.

In general, a free space optical (FSO) link consists of an optical signal transmitter and receiver. The transmitter is modulated at a high speed, encoding the information to be sent on the optical radiation emitted by the transmitter. The output light is then typically focused through a telescope to facilitate pointing the optical radiation towards the receiver. The receiver typically consists of a series of optical filters to remove background noise, while the signal from the detector is amplified and sent to a demodulator circuit to recover the information from the transmitted signal. The communication channel can comprise the Earth's atmosphere. FSO communication involving lasers is subject to a number of complications due to the non-ideal optical properties of the communication channel. More specifically, the laser signal will be attenuated by the atmosphere due to the presence of absorption, scintillation, scattering, propagation geometry, and other effects. The total radiation attenuation from the atmosphere can typically be calculated as $$A(\lambda)=\alpha_{fog}(\lambda)+\alpha_{snow}(\lambda)+\alpha_{rain}(\lambda)+\alpha_{scattering}(\lambda),[dB/km]$$

Where $\alpha_x(\lambda)$ is attenuation caused by the given weather condition and $\lambda$ is the operational wavelength. This attenuation occurs as the atmosphere is made up of various small particles and molecules (fog, dust, aerosols, etc.) which results in absorption, scattering, and scintillation.

There do however exist atmospheric scintillation windows where transmittance through the atmosphere is high. The four main known windows are the visible, near-infrared (NIR), mid-infrared (Mid-IR or MIR), and far-infrared (FIR) ranges. Each of these windows has relatively high optical transmittance, though there are various advantages and drawbacks to each window.

One of the main technical challenges, regardless of the wavelength used, is scattering, which may take the form of Rayleigh and Mie scattering. Rayleigh scattering occurs when the light interacts with particles that are significantly smaller than the wavelength, and is characterized by a scattering cross-section:

$$\sigma_{Rayleigh} = \frac{8\pi^3(n^2-1)^2}{3N^2\lambda^4}$$

As will be appreciated by the dependency on $\lambda^{-4}$, relatively smaller wavelengths will scatter much more significantly than relatively larger wavelengths. Fortunately, the NIR, MIR, and FIR bands have long enough wavelengths that Rayleigh scattering can typically be neglected versus Mie scattering. Mie scattering occurs when the particle size is close to the same size as that of a beam's wavelength. This form of scattering is not as dependent on the wavelength as Rayleigh scattering. As has been appreciated by the inventor, it is advantageous to prioritize the use of longer wavelengths to minimize scattering, which is a large source of attenuation with FSO signals.

The NIR band (~800-1550 nm) has the advantage that a number of laser diodes and detectors for this band are widely available (in particular the 1300-1550 nm range) due to the ubiquity of telecommunications technology based on fiber communication using these wavelengths. Some satellite communication systems have successfully utilized a 1550 nm laser diode-based system for ground-to-satellite and satellite-to-satellite communication. These systems have the benefit of being able to be modulated at very high speeds (>10 Gbps), allowing for large amounts of data to be sent during the limited time a low Earth orbit (LEO) satellite may be in range of a ground station.

At this wavelength however, there is significant attenuation from weather such as fog where the airborne particles are comparable in size to the NIR band wavelengths, leading to heavy losses from Mie scattering. In very dense fog, it is possible to be limited to a maximum range of 500 meters, which is unacceptable for LEO communications that can take place over distances of over 400 km. This results in a link availability as low as 10% to 40% for a single satellite and ground station, which can be unacceptable for certain applications.

The MIR band (e.g. 3 to 5 μm) provides significantly improved performance over the NIR band for the majority of weather conditions. It is possible to generate MIR light using nonlinear optical crystals by way of difference frequency generation. Nonlinear optical effects may be quasi-phase matched to achieve efficient conversion of the two input wavelengths to a new output MIR wavelength. The quasi-phase matching properties may be attained through the use of ferroelectric domain engineering to create a nonlinear optical crystal with spatially modulated nonlinear properties. Ferroelectric domain engineering involves applying a strong electric field using fabricated micro-scale electrodes, where the periodicity of the electrodes (typically between 5 and 50 μm) determines which wavelengths the nonlinear optical crystal will be able to produce efficiently. Accordingly, the nonlinear optical crystals described herein can be configured to efficiently produce a variety of different wavelengths.

Difference frequency generation involves two input photons at angular frequencies ω1 and ω2 that are annihilated within a nonlinear crystal in order to generate one output photon of frequency ω3. This is a parametric process and so energy conservation is maintained. The output frequency can be determined with the following relation:

$$\hbar\omega_1 - \hbar\omega_2 = \hbar\omega_3$$

As discussed in more detail herein, it is thus possible to generate MIR light with careful selection of the two input laser frequencies. The information is encoded on the transmitter via modulating one of the input lasers at wavelength $\lambda_2$ or frequency ω2, which in some embodiments comprise a telecommunications band 1550 nm laser diode modulated at >1 Gbps speeds.

This is achieved by generating infrared light in the 3 to 5 μm atmospheric scintillation band, where transmission is high and Rayleigh and/or Mie scattering is minimized.

In some embodiments, the transmitter comprises a pumping laser, a high-speed modulated laser, an optical cavity including a gain medium which is optically excited by the pumping laser, a difference frequency generation nonlinear optical crystal and an output coupler. The transmitter may also comprise various focusing, collimating and compressing elements.

Amplification of the two input lasers and careful design of the laser cavity and high-speed modulation of one of the input lasers allows for high power, high speed continuous wavelength (CW) laser operation for sending information.

The receiver is very similar in structure to the difference frequency generation transmitter, except that a sum frequency generation nonlinear crystal is used instead of a difference frequency generation optical nonlinear crystal.

The sum of the two input angular frequencies of the sum frequency generation optical nonlinear crystal can be provided by:

$$\hbar\omega_1 + \hbar\omega_2 = \hbar\omega_3$$

Incoming MIR light transmitted from, for example, a satellite can be upconverted to above the 800 nm wavelength range, for which wavelength range high-sensitivity, high-speed detectors are commercially available. In some embodiments, a silicon avalanche photodiode (Si APD) detector can be used. Other examples of suitable detectors include, but are not limited to p/intrinsic/n-region (PIN) photodiodes and heterodyne detectors that are capable of detecting phase and frequency changes in incoming signals. Frequency conversion avoids the main disadvantages of using MIR light, which is finding affordable detectors with a suitable speed and sensitivity.

In some embodiments, the receiver comprises a pumping laser, an optical cavity, optics configured to collimate an optical signal from, for example, a satellite, and direct the collimated optical signal into the optical cavity. The optical cavity comprises a gain medium which is optically excited by the pumping laser, a sum frequency generation nonlinear optical crystal and an output coupler. The receiver may also comprise various focusing, collimating and compressing elements. The effectiveness of the detector will depend, in part, on collimating the incoming laser light to a beam diameter of less than 100 μm so that sufficient optical intensity exists for nonlinear optical effects to manifest within the nonlinear crystal.

With reference to FIGS. 1 to 6, specific examples of apparatus described herein will now be described.

FIG. 1 is a schematic block diagram of an example optical transmitter in accordance with the present disclosure. It comprises a pump diode and an optically pumped laser crystal, as well as a second laser which may be used with the nonlinear crystal for difference frequency generation of the output light in the MIR range. In this example, a beam combiner is used to combine beams In some embodiments, this process can be facilitated by the use of a beam combiner to combine the beam emitted from the optically pumped laser crystal with the second laser beam prior to coupling with the nonlinear optical crystal, as well as miscellaneous focusing, collimating and compressing optics.

In particularly advantageous embodiments, the laser beam emitted from the optically pumped laser crystal is completely confined within the laser cavity. In some embodiments, all of the components inside the laser cavity have anti-reflection coatings. A wavelength used in fiber optical communication can be used for the second laser so that high speed optical and electric components available on the market can be used in combination with the apparatus disclosed herein.

In some embodiments of FIG. 1, the transmitter 10 comprises a pumping laser 12, such as a pump diode (emitting a laser at, for example, 808 nm). Other examples of potentially suitable pumping lasers include but are not limited to InGaAs, AlGaAs and GaAs pump diodes, InGaAsP, InP, InGaAs, InAlGaAs fiber lasers and InGaN, GaN diodes. As used herein, the term "pump diode" includes, but is not limited to, a single laser diode, as well as diode stacks. The output of the pumping laser 12 may be focused by compressing lens 13, such as, but not limited to a fast-axis compressing lens.

Once compressed, the resulting beam enters the optical cavity 11 and excites a gain medium 15. In some embodiments, the gain medium 15 may be an optically pumped laser diode such as, but not limited to a neodymium-doped yttrium aluminum garnet (Nd:YAG) 1064 nm crystal. Examples of other suitable gain media include, but are not limited to, Neodymium-doped yttrium orthovanadate (Nd:YVO4), Neodymium-doped yttrium lithium fluoride (Nd:YLF), Neodymium-doped glass (Nd:glass), Neodymium-doped gadolinium vanadate (Nd:GdVO4), Neodymium-doped gadolinium gallium garnet (Nd:GDD), and other neodymium doped lasers (e.g. Nd:YAP, Nd:YALO, Nd:LSB, Nd:SFAP, Nd:KGW, Nd:KYW). The gain medium may comprise an input facet having a coating of high reflectance at the second wavelength and high transmittance at the pump wavelength.

A laser 18 is arranged to emit a beam into the optical cavity 11. In some embodiments, the laser 18 may be a high-speed modulated source onto which information to transmit is encoded. Examples of high-speed modulated sources include, but are not limited to, a laser diode modulated at over 1 Gbps.

The beams from laser 18 and gain medium 15 are coupled into a difference frequency generation nonlinear optical crystal 17. In some embodiments, the nonlinear optical crystal 17 is a periodically poled lithium niobate (PPLN) crystal. Other examples of suitable crystals include, but are not limited to, periodically poled lithium tantalate (LiTaO3) and potassium titanyl phosphate (KTP).

The difference between a nonlinear optical crystal used for difference frequency generation (DFG) and a nonlinear optical crystal used for sum frequency generation (SFG) is the period of the poling applied to the crystal. In order to ensure efficient phase matching for the selected wavelengths, the phase matching relationship $\Delta k = k_3 - k_2 - k_1 - k_{pump} = 0$ must be satisfied, where:

$$k_{1,2,3} = \frac{2\pi n_{1,2,3}}{\lambda_{1,2,3}}$$

In the above, $k_{1,2,3}$ represents the wavevector of the light ($\lambda$ is the wavelength of the pump, signal, or idler, and n is the refractive index of the crystal at that wavelength), where $k_{pump} = 2\pi/\Lambda$, where $\Lambda$ is the period of the nonlinear crystal. Accordingly, the period of the crystal must change in order to ensure efficient phase matching at the different wavelengths used for DFG and SFG. For example, in some embodiments, a DFG nonlinear crystal may have a period of substantially 30.5 μm, while a SFG nonlinear crystal may have a period of substantially 23.5 μm.

In some embodiments, the beams may be coupled by way of a beam combiner 16. As described in more detail herein, other apparatus may be used form combining and coupling the beams in the nonlinear optical crystal. For example, dichroic mirrors (mirrors providing high reflectance of certain wavelengths and high transmittance of other wavelengths). In embodiments making use of fiber lasers, it may also be possible to use fiber combiners that comprise multiple input fibers (one for each wavelength) that then merge into a single fiber, combining the different wavelengths. Optics 29 may also contribute to overlapping the beam at the first wavelength and the beam at the second wavelength inside the nonlinear crystal.

The optical cavity 11 may comprise an input coupler 14 and an output coupler 19. In some embodiments, the input coupler 14 and output coupler 19 are mirrors, such as dichroic mirrors.

In particularly advantageous embodiments of any of the devices shown in FIGS. 1 to 6, the input coupler and output coupler confine the beam emitted from the gain medium (e.g. at a wavelength of, for example, 1064 nm) completely within the laser cavity.

The advantage of confining the emitted light from the gain medium to a laser cavity in the intracavity design is that much higher light intensities can be reached inside of a laser cavity compared to outside of a laser cavity. This is accomplished due to highly reflective coatings applied to the input/output couplers at either end of the cavity that make up the intracavity design, allowing the circulating photons to build up over time until a steady-state value is reached when the loss of photons due to intrinsic effects like absorption and scattering equals the photon creation rate.

As a non-limiting example, a 1064 nm laser may be able to attain output powers of a few Watts, but for a 1064 nm laser cavity with highly reflective 1064 nm mirrors, reaching hundreds of Watts of intracavity power is feasible. This is a significant advantage of the various apparatus described herein, as the nonlinear wavelength conversion efficiency depends on the intensity, with higher intensities allowing for more efficient conversion of the pump photons into the desired signal or idler wavelengths via sum frequency conversion and difference frequency conversion. Accordingly, the output power of the transmitter is thus determined by the Q-factor of the intracavity design as well as the output powers of the laser 18 and the gain medium 15.

Figure 2:
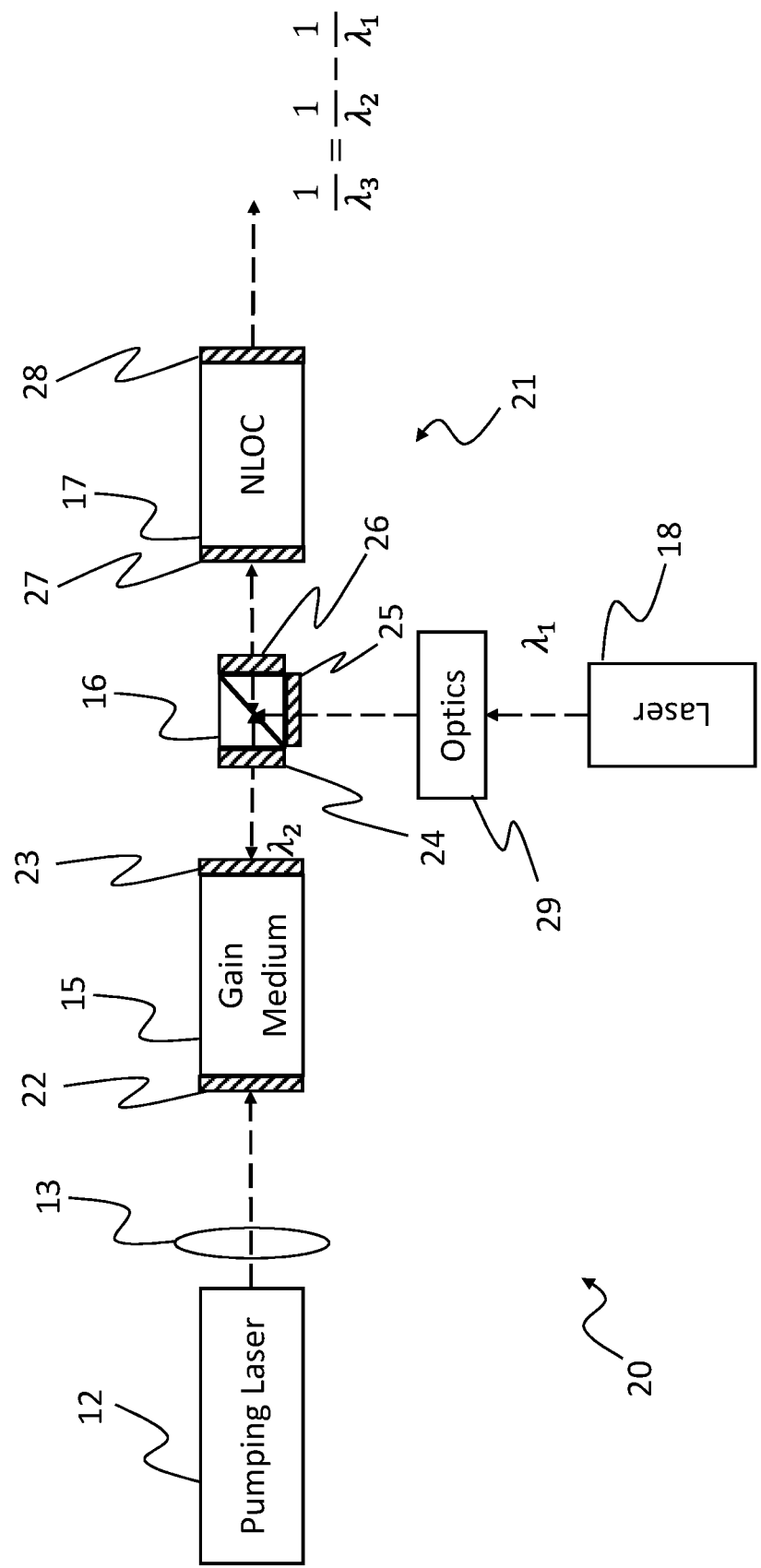
FIG. 2 is a schematic block diagram of another example optical transmitter in accordance with an embodiment of the present disclosure.

FIG. 2 is a schematic block diagram of another example optical transmitter in accordance with the present disclosure. The transmitter shown in FIG. 2 has a similar structure as that shown in FIG. 1, though input coupler 14 and output coupler 19 have been replaced by coatings having high reflectance, as described in more detail herein. In some embodiments, the gain medium 15, nonlinear optical crystal 17 and beam combiner 16, comprise high reflectance and high transmittance (or anti-reflective) coatings applied to improve the performance of the structure.

In particular, in some embodiments of the transmitter shown in FIG. 2, performance has been optimized through the addition of various high reflectance and high transmittance coatings. In one example, the input facet 22 of gain medium 15 may be coated with a coating having high transmittance at the pumping laser 12 wavelength $\lambda_0$. The input facet 22 of the gain medium 15 may also be coated with a coating having high reflectance at the output wavelength $\lambda_2$. In some embodiments, the output facet 23 may also comprise an anti-reflection coating at the output wavelength $\lambda_2$.

The nonlinear crystal 17 may have an input facet 27 coated with an anti-reflection coating at $\lambda_2$ and a high transmittance coating at $\lambda_1$. The input facet 27 of nonlinear crystal 17 may also have a coating having high reflectance at $\lambda_0$ and $\lambda_3$, where $\lambda 3 = 1/(1/\lambda_2 - 1/\lambda_1)$ and represents the output light generated via difference frequency generation. The output facet 28 may comprise a coating having high reflectance at $\lambda_2$. In some embodiments, the output facet 28 may also comprise a coating having high reflectance at $\lambda_1$. In some embodiments, the output facet 28 may also comprise a coating having high transmittance at $\lambda_3$. In the above examples, the coatings having high reflectance may serve as input and output couplers.

In some embodiments, the beam combiner 16 may comprise an input facet 24 coated with an anti-reflection coating at $\lambda_2$, an output facet 26 along the direction of the laser cavity axis coated with a coating having anti-reflection at $\lambda_2$ and a high transmittance at $\lambda_1$ and/or an input facet 25 perpendicular to the laser cavity axis coated with a coating having high transmittance at $\lambda_1$. Suitable high reflectance and anti-reflection coatings would be those capable of achieving R>99.5% and T>99.5%, respectively, and are known in the art. Suitable high transmission coatings would be those capable of achieving at least T>90% and are also known in the art. In all of the embodiments described herein, high transmission coatings may be replaced with anti-reflection coatings.

Figure 3:
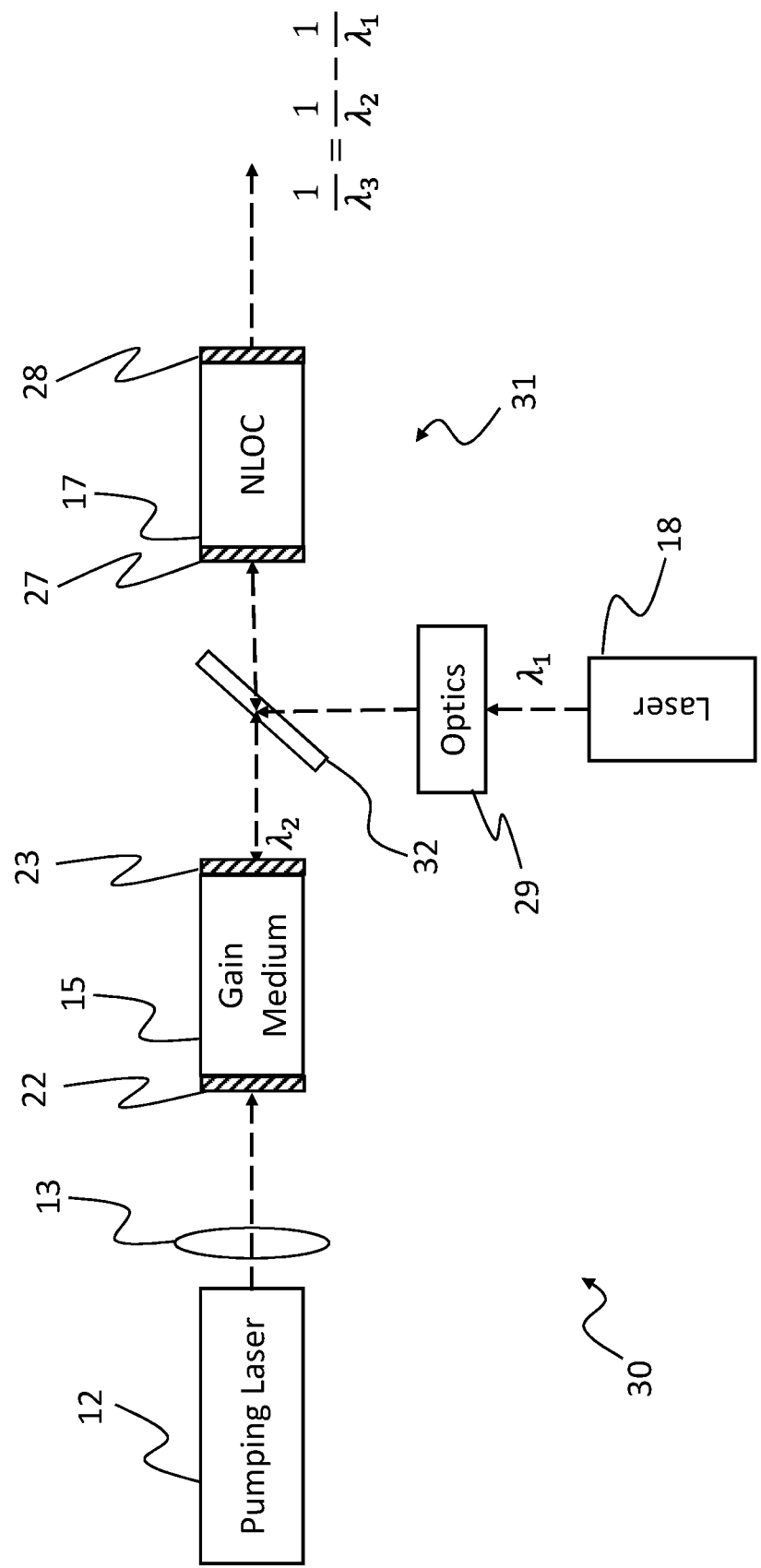
FIG. 3 is a schematic block diagram of yet another example optical transmitter in accordance with an embodiment of the present disclosure.

As shown in FIG. 3, the beam combiner 16 may be replaced by a dichroic mirror 32, which provides anti-reflection at $\lambda_2$ and high reflectance at $\lambda_1$. In particular, the transmitter shown in FIG. 3 is similar to the transmitter shown in FIG. 2, except that the beam combiner 16 has been replaced with a dichroic mirror 32 that provides anti-reflection at $\lambda_2$ (e.g. transmission of >99.5%) and high reflectance at $\lambda_1$ (e.g. reflection of >97%).

In some of the above transmitter embodiments, the laser 18 may comprise a tunable laser with narrow linewidth. In other embodiments, the laser 18 may comprise a modulated high-power laser from a seed laser diode and an optical amplifier. In some examples, the optical amplifier may be an erbium-doped fiber amplifier (EDFA). In other examples, the optical amplifier may be any other suitable optical amplifier.

Figure 4:
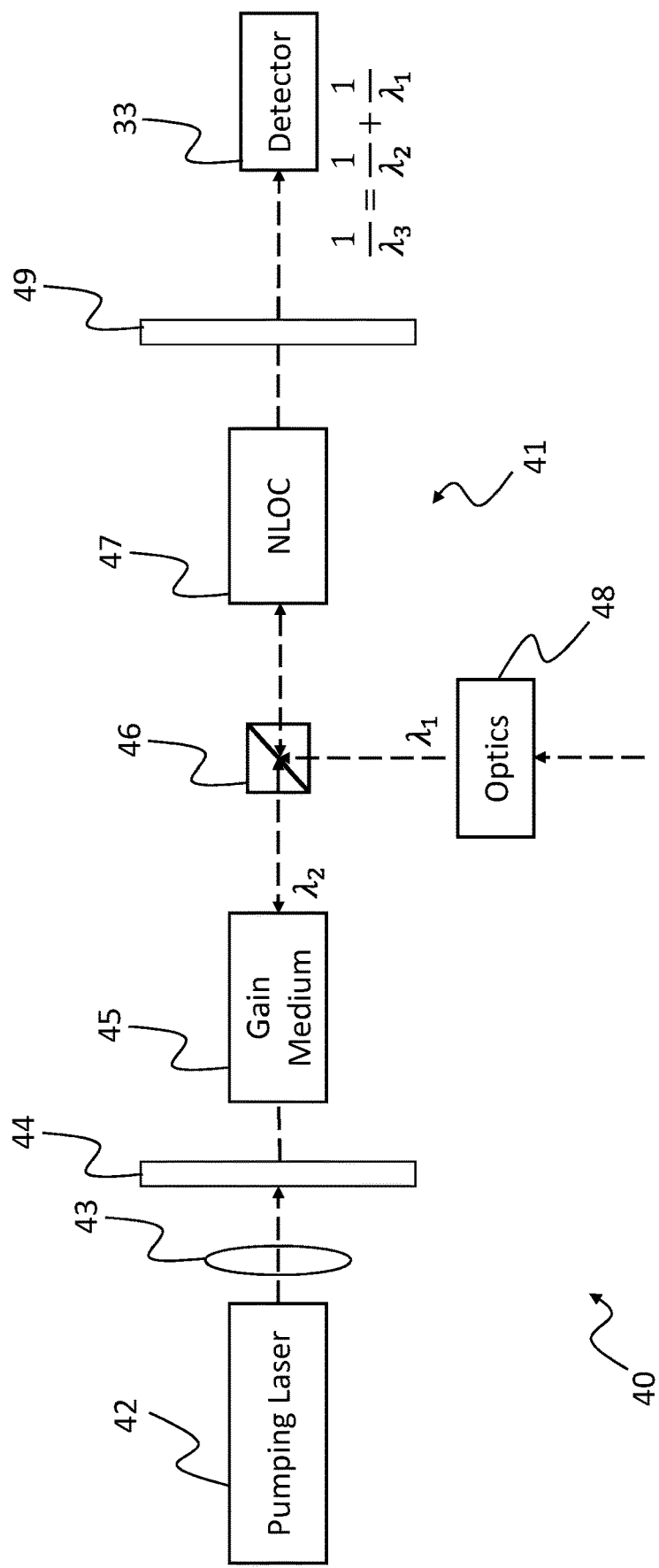
FIG. 4 is a schematic block diagram of an example optical receiver in accordance with an embodiment of the present disclosure.

FIG. 4 is a schematic block diagram of an example optical receiver in accordance with an embodiment of the present disclosure. As can be seen from FIG. 4, the general structure of receiver 40 may be similar to that of receiver 10 shown in FIG. 1. Two significant differences however are the laser source for $\lambda_1$ and that the nonlinear optical crystal 47 is designed for sum frequency generation, in accordance with, for example, the design principles described elsewhere herein.

As the device shown in FIG. 4 is a receiver, the first laser $\lambda_1$ is the incoming MIR light from, for example, a satellite communication platform. This light is converted to a third wavelength $\lambda_3$ in the near infrared range so that high speed and sensitive detectors readily available on the market can be used.

In particular, in one embodiment of FIG. 4, the receiver 40 comprises a pumping laser 42, such as a pump diode (emitting a laser at, for example, 808 nm). The output of the pumping laser 42 may be focused by compressing lens 43, such as, but not limited to a fast-axis compressing lens. Once compressed, the resulting beam enters the optical cavity 41 and excites a gain medium 45. In some embodiments, the gain medium 45 may be an optically pumped laser diode such as, but not limited to a neodymium-doped yttrium aluminum garnet (Nd:YAG) 1064 nm crystal. The first input at $\lambda_1$ comprises the input MIR light from, for example, a satellite or high-altitude communications platform. This light may be collimated to a beam size of less than 100 microns via optics 48. In some embodiments, optics 48 may comprise a receiver Cassegrain-style telescope configured to collect the input MIR light, combined with a series of suitable optical filters, polarization controllers, and collimators arranged to simulate the output intensity of laser 18.

The output of optics 48 and the output of gain medium 45 are then coupled into the sum frequency generation nonlinear crystal 47. In some embodiments, this is achieved through the use of a beam combiner 46 with appropriate facet coatings. The gain medium 45 may comprise an input facet having a coating of high reflectance at the second wavelength and high transmittance at the pump wavelength.

The optical cavity 41 may comprise an input coupler 44 and an output coupler 49. In some embodiments, the input coupler 44 and output coupler 49 are mirrors, such as dichroic mirrors. Again, in particularly advantageous embodiments, the input coupler 44 and output coupler 49 confine the beam emitted from the gain medium (e.g. at a wavelength of, for example, 1064 nm) completely within the laser cavity. Optics 48 may also contribute to overlapping the beam at the first wavelength and the beam at the second wavelength inside the nonlinear crystal.

The output power of the receiver is thus determined by the Q-factor of the intracavity design as well as the output powers of the laser 18 and the gain medium 15. As shown in FIG. 4, the output of the sum frequency generation nonlinear crystal 47 can be focused onto a detector 33 which may comprise a silicon avalanche photodiode (Si APD) detector. Other examples of suitable detectors include, but are not limited to p/intrinsic/n-region (PIN) photodiodes and heterodyne detectors that are capable of detecting phase and frequency changes in incoming signals.

Figure 5:
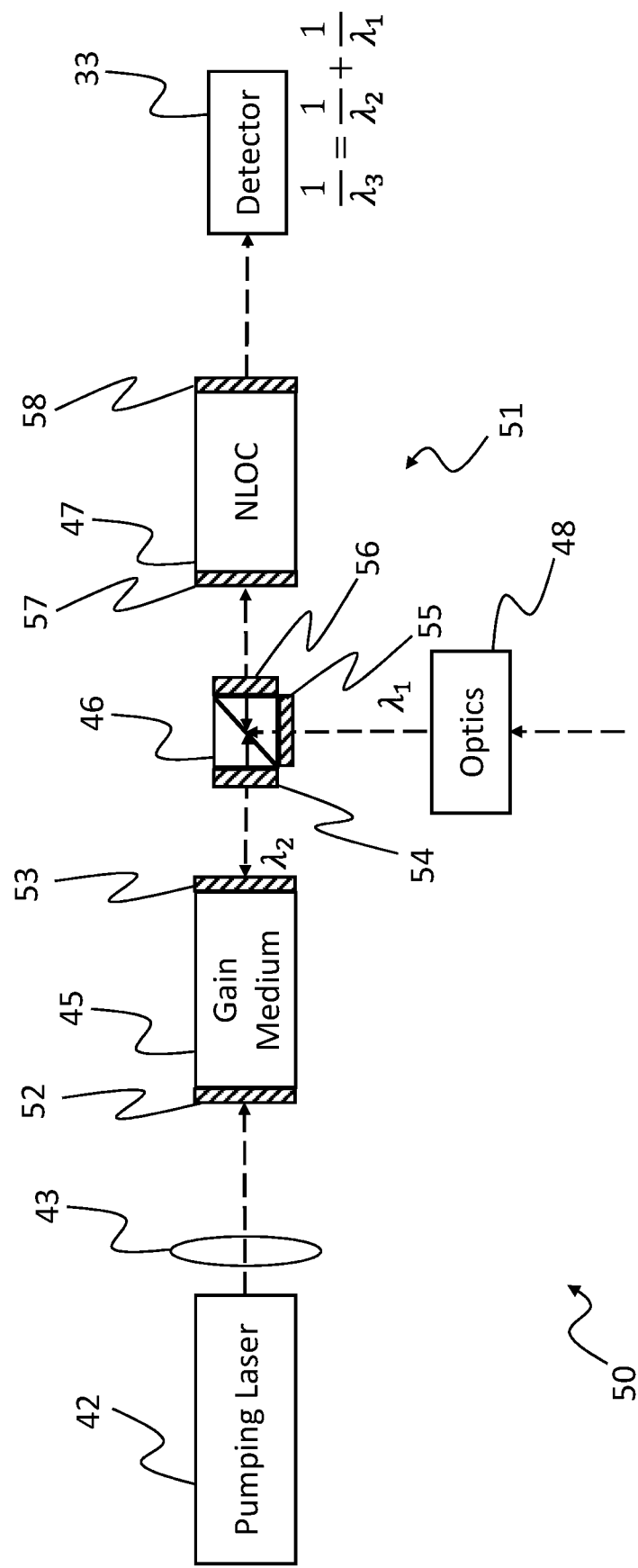
FIG. 5 is a schematic block diagram of another example optical receiver in accordance with an embodiment of the present disclosure.

The receiver shown in FIG. 5 has a similar structure as that shown in FIG. 4, though input coupler 44 and output coupler 49 have been replaced by coatings having high reflectance, as described in more detail herein. In some embodiments, the gain medium 45, nonlinear optical crystal 47 and beam combiner 46, comprise high reflectance and high transmittance (or anti-reflective) coatings applied to improve the performance of the structure.

In particular, in some embodiments of the receiver shown in FIG. 5, performance has been optimized through the addition of various comprise high reflectance and high transmittance coatings. In one example, the input facet 52 of gain medium 45 may be coated with a high transmittance coating at the pumping laser 42 wavelength $\lambda_0$. The input facet 52 of the gain medium 45 may also be coated with a coating having high reflectance at the output wavelength $\lambda_2$. In some embodiments, the output facet 53 may also comprise an anti-reflection coating at the second wavelength $\lambda_2$.

The nonlinear crystal 47 may have an input facet 57 coated with an anti-reflection coating at $\lambda_2$ and a high transmittance at $\lambda_1$. The input facet 57 of the nonlinear crystal 47 may also have a coating having high reflectance at $\lambda_0$ and $\lambda_3$, where $\lambda_3 = 1/(1/\lambda_2 + 1/\lambda_1)$ and represents the output light generated via sum frequency generation. The output facet 58 may comprise a coating having high reflectance at $\lambda_2$. In some embodiments, the output facet 58 may also comprise a coating having high reflectance at $\lambda_1$. In some embodiments, the output facet 58 may also comprise a coating having high transmittance at $\lambda_3$. In the above examples, the coatings having high reflectance may serve as input and output couplers.

In some embodiments, the beam combiner 46 may comprise an input facet 54 coated with an anti-reflection coating at $\lambda_2$, an output facet 56 along the direction of the laser cavity axis coated with an anti-reflection coating at $\lambda_2$ and a high transmittance coating at $\lambda_1$ and/or an input facet 55 perpendicular to the laser cavity axis coated with a coating having high transmittance at $\lambda_1$.

The detector 33 may comprise any of the same components as those described with reference to FIG. 4.

Figure 6:
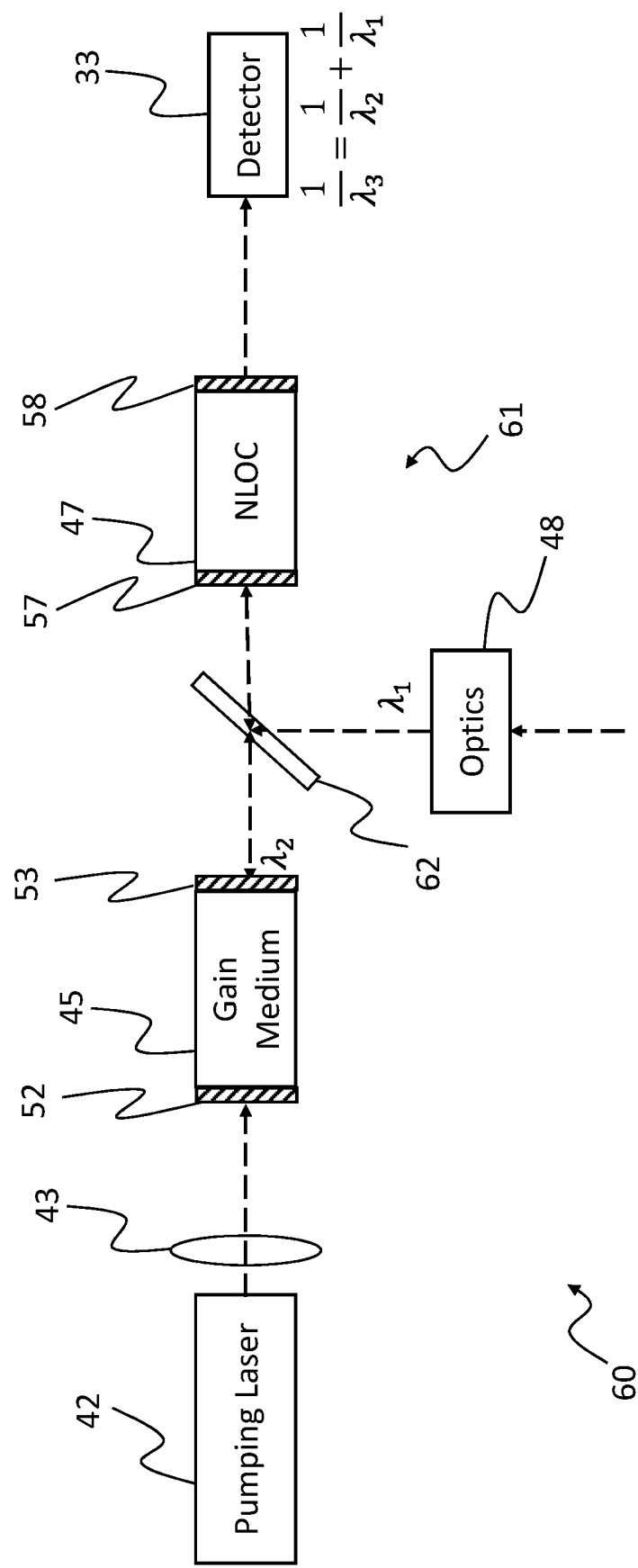
FIG. 6 is a schematic block diagram of yet another example optical receiver in accordance with an embodiment of the present disclosure.

As shown in FIG. 6, the beam combiner 46 may be replaced by a dichroic mirror 62, which provides anti-reflection at $\lambda_2$ and high reflectance at $\lambda_1$. In particular, the receiver shown in FIG. 6 is similar to the transmitter shown in FIG. 5, except that the beam combiner 46 has been replaced with a dichroic mirror 62 that provides anti-reflectance at $\lambda_2$ and high reflectance at $\lambda_1$, as described in more detail herein.

The description and drawings merely illustrate the principles of the invention. It will thus be appreciated that those skilled in the art will be able to devise various arrangements that, although not explicitly described or shown herein, embody the principles of the invention and are included within the scope of the appended claims. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions.

Moreover, all statements herein reciting principles, aspects, and embodiments of the invention, as well as specific examples thereof, are intended to encompass equivalents thereof. It should also be appreciated by those skilled in the art that any block diagrams herein represent conceptual views of illustrative optical apparatus embodying the principles of the invention.

Unless otherwise indicated, the definitions and embodiments described in this and other sections are intended to be applicable to all embodiments and aspects of the present application herein described for which they are suitable as would be understood by a person skilled in the art.

In understanding the scope of the present application, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. The term "consisting" and its derivatives, as used herein, are intended to be closed terms that specify the presence of the stated features, elements, components, groups, integers, and/or steps, but exclude the presence of other unstated features, elements, components, groups, integers and/or steps.

Terms of degree such as "substantially", "nearly" and "approximately" as used herein mean a reasonable amount of deviation of the modified term such that the end result is not significantly changed. These terms of degree should be construed as including a deviation of at least ±5% of the modified term if this deviation would not negate the meaning of the word it modifies.

The term "and/or" as used herein means that the listed items are present, or used, individually or in combination. In effect, this term means that "at least one of" or "one or more" of the listed items is used or present.

While the present application has been described with reference to examples, it is to be understood that the scope of the claims should not be limited by the embodiments set forth in the examples but should be given the broadest interpretation consistent with the description as a whole.

The invention claimed is:

1. A difference frequency generation optical transmitter for free space optical communication comprising:
   a) a linear optical cavity;
   b) a laser configured to emit a high-speed modulated communication signal at a first wavelength;
   c) optics configured to direct the high-speed modulated communication signal into the linear optical cavity; and
   d) a pumping laser,
   wherein the linear optical cavity includes:
      i) a gain medium configured to emit a continuous wave laser light signal at a second wavelength when optically excited by the pumping laser,
      ii) a difference frequency generation nonlinear optical crystal configured to generate a third wavelength in the mid-infrared range, the third wavelength being the difference frequency of the second wavelength and the first wavelength and being modulated at the same speed as the first wavelength, and
      iii) an output coupler configured to allow partial transmission of the third wavelength.

2. The difference frequency generation optical transmitter of claim 1, wherein the linear optical cavity is configured to completely contain the continuous wave laser light signal at the second wavelength.

3. The difference frequency generation optical transmitter of claim 1, wherein the gain medium comprises an input facet having a high reflectance coating at the second wavelength and an output facet having an anti-reflection coating at the second wavelength.

4. The difference frequency generation optical transmitter of claim 1, wherein the difference frequency generation nonlinear optical crystal comprises an input facet having an anti-reflection coating at the second wavelength and a high transmittance coating at the first wavelength and an output facet having high reflectance coating at the second wavelength and a high transmittance coating at the third wavelength.

5. The difference frequency generation optical transmitter of claim 4, wherein the difference frequency generation nonlinear optical crystal comprises an input facet having a high reflectance coating at the third wavelength.

6. The difference frequency generation optical transmitter of claim 5, wherein the difference frequency generation nonlinear optical crystal comprises an output facet having a high reflectance coating at the first wavelength.

7. The difference frequency generation optical transmitter of claim 1, wherein the linear optical cavity further comprises a dichroic mirror configured to combine the modulated signal at the first wavelength and the continuous wave laser light signal at the second wavelength.

8. The difference frequency generation optical transmitter of claim 7, wherein the dichroic mirror provides anti-reflection at the second wavelength and high reflectance at the first wavelength.

9. The difference frequency generation optical transmitter of claim 1, wherein the linear optical cavity further comprises a beam combiner configured to combine the modulated signal at the first wavelength and the continuous wave laser light signal at the second wavelength.

10. The difference frequency generation optical transmitter of claim 9, wherein the beam combiner comprises:
   a) an input facet along a direction of the laser cavity axis having an anti-reflection coating at the second wavelength;
   b) an output facet along a direction of the laser cavity axis having an anti-reflection coating at the second wavelength and a high transmittance coating at the first wavelength; and
   c) an input facet along a direction perpendicular to the laser cavity axis having high transmittance coating at the first wavelength.

* * * * *